(12) United States Patent
Sim et al.

(10) Patent No.: US 11,579,538 B2
(45) Date of Patent: Feb. 14, 2023

(54) LOAD PORT UNIT, STORAGE APPARATUS INCLUDING THE SAME, AND EXHAUST METHOD

(71) Applicant: SEMES CO., LTD., Cheonan-si (KR)

(72) Inventors: Yong Hun Sim, Hwaseong-si (KR); Jinwook Jung, Pyeongtaek-si (KR); Seungwon Kim, Yongin-si (KR); Seokhee Kim, Seoul (KR); Jaehee Hwang, Suwon-si (KR); Jun Cheol Park, Incheon (KR)

(73) Assignee: SEMES CO., LTD., Cheonan-si (KR)

( * ) Notice: Subject to any disclaimer, the term of this patent is extended or adjusted under 35 U.S.C. 154(b) by 105 days.

(21) Appl. No.: 17/130,619

(22) Filed: Dec. 22, 2020

(65) Prior Publication Data

US 2021/0208517 A1 Jul. 8, 2021

(30) Foreign Application Priority Data

Jan. 6, 2020 (KR) ........................ 10-2020-0001240

(51) Int. Cl.
*G03F 7/20* (2006.01)
*H01L 21/67* (2006.01)
*B65G 47/90* (2006.01)
*H01L 21/677* (2006.01)

(52) U.S. Cl.
CPC ......... *G03F 7/70741* (2013.01); *B65G 47/90* (2013.01); *G03F 7/70933* (2013.01); *H01L 21/67017* (2013.01); *H01L 21/6773* (2013.01); *H01L 21/67288* (2013.01); *H01L 21/67733* (2013.01); *H01L 21/67736* (2013.01)

(58) Field of Classification Search
CPC ............... F24F 11/24; H01L 21/67017; H01L 21/67288; H01L 21/6773; H01L 21/67733; H01L 21/67736; G03F 7/70741; G03F 7/70933
See application file for complete search history.

(56) References Cited

U.S. PATENT DOCUMENTS 5,551,984 A * 9/1996 Tanahashi ......... H01L 21/67757
118/724
2005/0121144 A1* 6/2005 Edo ....................... G03F 7/7075
156/345.32

FOREIGN PATENT DOCUMENTS

| JP | 2010262214 | 11/2010 |
|---|---|---|
| KR | 10-2009-0003955 | 1/2009 |
| KR | 1020090053890 | 5/2009 |
| KR | 10-2014-0019028 | 2/2014 |
| KR | 1020160017779 | 2/2016 |

(Continued)

*Primary Examiner* — Ronald P Jarrett

(57) ABSTRACT

A storage apparatus for storing an object includes a load port unit that a receptacle is loaded onto or unloaded from, in which the receptacle accommodates the object in a storage space formed by a body and a cover that covers the body, and a controller. The load port unit includes a housing having an interior space, a stage member that is provided on the housing and that opens the storage space by moving the body, the receptacle being seated on the stage member, and an exhaust tube that evacuates a spacing space between the body and the cover spaced apart from each other. One end of the exhaust tube faces toward the spacing space, and an opposite end of the exhaust tube faces toward the interior space.

12 Claims, 11 Drawing Sheets

(56) References Cited

FOREIGN PATENT DOCUMENTS

KR 10-1841753 3/2018
KR 1020180127763 11/2018

* cited by examiner

LOAD PORT UNIT, STORAGE APPARATUS INCLUDING THE SAME, AND EXHAUST METHOD

CROSS-REFERENCE TO RELATED APPLICATIONS

A claim for priority under 35 U.S.C. § 119 is made to Korean Patent Application No. 10-2020-0001240 filed on Jan. 6, 2020, in the Korean Intellectual Property Office, the entire contents of which are hereby incorporated by reference.

BACKGROUND

Embodiments of the inventive concept described herein relate to a load port unit, a storage apparatus including the same, and an exhaust method.

A photo mask (e.g., a lithography mask or a reticle) is used to transfer a photoresist pattern. The photo mask is moved between a lithography station, a process station, and a storage station in a state of being stored in a container (or, a carrier, a cassette, or a pod).

Because the photo mask is used to transfer the photoresist pattern as described above, a high cleanliness level is required for the photo mask. Accordingly, attachment of impurities, such as particles, to the photo mask has to be minimized in the container in which the photo mask is stored and the storage station for storing the photo mask. To achieve this, when the photo mask is stored in the storage station, the container is seated on a load port unit of the storage station and is opened. The photo mask stored in the container is carried into an inspection member of the storage station. The inspection member inspects the cleanliness level of the photo mask. When the photo mask satisfies a required cleanliness level, the photo mask is stored in the storage station, and when the photo mask does not satisfy the required cleanliness level, the photo mask is carried to the outside without being stored in the storage station. Accordingly, photo masks satisfying the required cleanliness level are stored in the storage station.

However, in a process of opening the container to carry the photo mask into the storage station, particles may be caused by mechanical friction of the container. Furthermore, when the container is opened, the photo mask is exposed to a space in the storage station. In this case, particles floating and/or remaining in the storage station may be attached to the photo mask.

SUMMARY

Embodiments of the inventive concept provide a load port unit for maintaining the cleanliness level of an object at a high level, a storage apparatus including the load port unit, and an exhaust method.

Embodiments of the inventive concept provide a load port unit for minimizing attachment of impurities, such as particles, to an object, a storage apparatus including the load port unit, and an exhaust method.

Embodiments of the inventive concept provide a load port unit for minimizing attachment of particles floating and/or remaining in the load port unit to an object, a storage apparatus including the load port unit, and an exhaust method.

The technical problems to be solved by the inventive concept are not limited to the aforementioned problems, and any other technical problems not mentioned herein will be clearly understood from the following description by those skilled in the art to which the inventive concept pertains.

According to an exemplary embodiment of the present invention, a storage apparatus for storing an object includes a load port unit configured to load or unload a receptacle, the receptacle having a body and a cover which are detachably attached to each other and further having a first storage space which is defined by the body and the cover attached to each other, the object being accommodated in the first storage space of the receptacle and placed on the body, a storage unit having a second storage space in which the object is to be stored, a transfer unit for transferring the object between the first storage space of the load port unit and the second storage space of the storage unit, and a controller coupled to the load port unit and the transfer unit. The load port unit includes a housing having an interior space, a stage member provided on top of the housing and configured to receive the receptacle and separate the body from the cover so that the body on which the object is placed is introduced into the interior space of the housing and the cover of the receptable is attached to the stage member, and an exhaust tube configured to evacuate the interior space of the housing, the exhaust tube including a first end which is adjacent to a portion of the interior space of the housing, the portion of the interior space corresponding to a space between the cover attached to the stage member and the body introduced into the interior space of the housing, and a second end adjacent to a bottom surface of the housing. The exhaust tube is provided with a first fan that is installed at the first end of the exhaust tube and a second fan that is installed at a location of the exhaust tube between the first end and the second end. The first fan and the second fan are positioned at an inside of the exhaust tube. The controller controls the first fan and the second fan such that the second fan is driven after the first fan is driven.

The controller controls the first fan and the second fan such that the second fan is driven after the stage member completely separates the body of the receptacle from the cover thereof.

The load port unit further includes an inspection member for receiving the object from the body of the receptacle separated from the cover thereof and inspecting the object. The controller controls the first fan, the second fan, and the transfer unit such that the second fan is driven after the inspection member receiving the object supported on the body of the receptacle.

The controller controls the first fan and the second fan such that the second fan is driven after the inspection member finishing inspection of the object received from the body of the receptacle.

The controller controls the first fan and the second fan such that the second fan is driven after the object is carried from the inspection member into the storage unit.

The first fan sucks an air of the interior space of the housing in a horizontal direction relative to an upper surface of the object which is on the body introduced in the interior space of the housing.

The second fan moves the sucked air by the first fan in a vertical direction, relative to the horizontal direction, toward the second end.

The exhaust tube includes a first portion including the first end of the exhaust tube and extending in a horizontal direction relative to an upper surface of the object which is on the body introduced in the interior space of the housing, and a second portion extending in a vertical direction, relative to the horizontal direction, from the first portion and including the second end of the exhaust tube.

The second fan is provided in the second portion.

According to an exemplary embodiment of the present invention, a load port unit for loading or unloading a receptacle, the receptacle having a body and a cover which being detachably attached to each other and further having a first storage space which is defined by the body and the cover attached to each other, the first storage space of the receptacle accommodating an object which is placed on the body, includes a housing having an interior space, a stage member provided on top of the housing, and receiving the receptacle and separating the body from the cover so that the body on which the object is placed is introduced into the interior space of the housing and the cover of the receptacle is attached to the stage member, and an exhaust tube for evacuating the interior space of the housing. The exhaust tube includes a first end which is adjacent to a portion of the interior space of the housing, the portion of the interior space corresponding to a space between the cover attached to the stage member and the body introduced into the interior space of the housing, and a second end adjacent to a bottom surface of the housing. The exhaust tube is provided with a first fan that is installed at the first end of the exhaust tube, and a second fan that is installed at a location of the exhaust tube between the first end and the second end. The first fan and the second fan are positioned at an inside of the exhaust tube. The first fan is controlled such that the first fan is driven during a time when the object is on the body introduced into the interior space of the housing.

The first fan and the second fan are controlled such that the first fan and the second fan are driven after the object is carried out of the interior space.

The first fan is configured to suck an air of the interior space of the housing in a horizontal direction relative to an upper surface of the object which is on the body introduced in the interior space of the housing. The second fan is configured to flow the sucked air by the first fan in a vertical direction, relative to the horizontal direction, toward the second end.

The exhaust tube includes a first portion including the first end of the exhaust tube and extending in a horizontal direction relative to an upper surface of the object which is on the body introduced in the interior space of the housing, and a second portion extending in a vertical direction, relative to the horizontal direction, from the first portion and including the second end of the exhaust tube.

According to an exemplary embodiment of the present inventive concept, a storage apparatus for storing a reticle includes a load port unit configured to load or unload a receptacle, the receptacle having a body and a cover which are detachably attached to each other and further having a first storage space which is defined by the body and the cover attached to each other, the reticle being accommodated in the first storage space of the receptacle and placed on the body, a storage unit having a second storage space in which the reticle is stored, and a transfer unit configured to transfer the reticle between the load port unit and the storage unit.

The load port unit includes a housing having an interior space, a stage member provided on top of the housing and configured to receive the receptacle and separate the body from the cover so that the body on which the reticle is placed is introduced into the interior space of the housing and the cover of the receptacle is attached to the stage member, and an exhaust tube configured to evacuate the interior space of the housing. The exhaust tube includes a first end which is adjacent to a portion of the interior space of the housing, the portion of the interior space corresponding to a space between the cover attached to the stage member and the body introduced into the interior space of the housing, and a second end adjacent to a bottom surface of the housing. The exhaust tube is provided with a first fan that is installed at the first end of the exhaust tube and a second fan that is installed at a location of the exhaust tube between the first end and the second end. The first fan and the second fan are positioned at an inside of the exhaust tube.

The storage apparatus further comprises a controller configured to control the first fan and the second fan such that the second fan is driven after the first fan is driven.

The controller controls the first fan and the second fan such that the second fan is driven after the stage member completely separates the body of the receptacle from the cover thereof.

The load port unit includes an inspection member configured to receive the reticle from the body of the receptacle separated from the cover thereof and inspect the reticle. The controller controls the first fan, the second fan, and the transfer unit such that the second fan is driven after the inspection member receiving the reticle supported on the body of the receptacle.

The controller controls the first fan and the second fan such that the second fan is driven after finishing inspection of the reticle received from the body of the receptacle.

The controller controls the first fan and the second fan such that the second fan is driven after the reticle is carried from the inspection member into the storage unit.

According to an exemplary embodiment of the present invention, an exhaust method of removing particles in a receptacle includes loading, on a stage member of a load port, the receptacle having a body and a cover which are detachably attached to each other and further having a first storage space which is defined by the body and the cover attached to each other, the first storage space accommodating an object, separating the body of the receptacle from the cover thereof by the stage member, thereby introducing the body with the object into an interior space of the load port, and evacuating the interior space of the load port to remove particles introduced into the interior space of the load port from the receptacle with the object therein. The evacuating of the interior space of the load port includes driving a first fan installed inside of an exhaust tube inserted into the interior space of the load port, and driving a second fan at a predetermined time after driving the first fan.

The exhaust method further includes transferring the object supported on the body to an inspection member included in a load port unit, inspecting a cleanliness level of the object in the inspection member, and transferring the object completely inspected in the inspection member to a storage unit connected to the load port or the outside of the load port. The driving of the second fan is performed after the inspecting of the cleanliness level of the object or the transferring the object to the storage unit or the outside of the load port.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
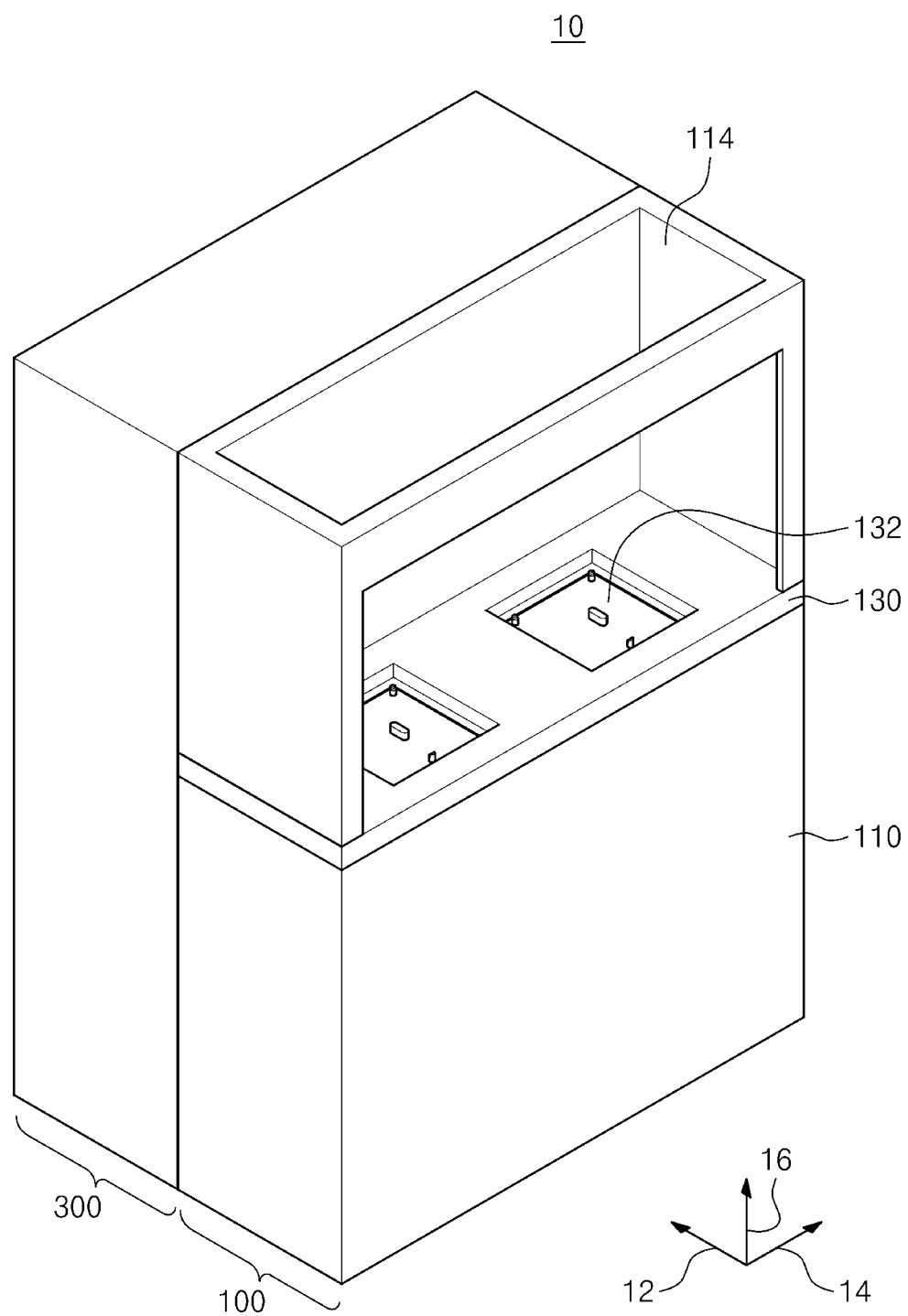
FIG. 1 is a view illustrating a storage apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Unless otherwise defined, all terms (including technical and scientific terms) used herein have the same meaning as commonly understood by those skilled in the art to which the inventive concept pertains. It will be further understood that terms, such as those defined in commonly used dictionaries, should not be interpreted in an idealized or overly formal sense unless expressly so defined herein.

Hereinafter, embodiments of the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

A storage apparatus of this embodiment may store an object. Furthermore, the storage apparatus of this embodiment may inspect the object and may store the object completely inspected. In addition, the storage apparatus of the inventive concept may be connected with a receptacle storage apparatus in which a receptacle having the object accommodated therein is stored. Alternatively, a transfer apparatus, such as an overhead hoist transport (OHT), may transfer the receptacle having the object accommodated therein to the storage apparatus of this embodiment.

The object may be a photo mask (e.g., a lithography mask or a reticle). The receptacle in which the object is accommodated may be a container (or, a carrier, a cassette, or a pod). Hereinafter, it will be exemplified that the object is a reticle. Furthermore, it will be exemplified that the receptacle is a pod. Without being limited thereto, however, the object and the receptacle may be variously modified. For example, the object may be a substrate such as a wafer or the like. The receptacle may be a front opening unified pod (FOUP) in which a wafer or the like is accommodated.

FIG. 1 is a view illustrating a storage apparatus according to an embodiment of the inventive concept. Referring to FIG. 1, the storage apparatus 10 according to an embodiment of the inventive concept may include a load port unit 100, a storage unit 300, a transfer unit 500, and a controller 700.

The load port unit 100 and the storage unit 300 may be disposed along a first direction 12 when viewed from above. Hereinafter, a direction perpendicular to the first direction 12 when viewed from above is defined as a second direction 14, and a direction perpendicular to the first direction 12 and the second direction 14 is defined as a third direction 16.

Receptacles 20 having objects R accommodated therein may be loaded onto, or unloaded from, the load port unit 100. The load port unit 100 may be provided with the receptacles 20 having the objects R accommodated therein. Subsequently, the load port unit 100 may recognize information included in the receptacles 20 having the objects R accommodated therein and may read information related to the receptacles 20 or the objects R. For example, the load port unit 100 may check whether the receptacles 20 correspond to a first type or a second type. When the receptacles 20 are of different types, the types of the objects R in the receptacles 20 may differ from one another. Here, the load port unit 100 may use various types of reading methods to recognize information from the receptacles 20 of different types. Furthermore, the load port unit 100 may use one type of reading method a plurality of times.

The load port unit 100 may have a receptacle entrance/exit opening 114. The receptacles 20 may be loaded onto, or unloaded from, the load port unit 100 through the receptacle entrance/exit opening 114 by a transfer apparatus such as an OHT.

The storage unit 300 may store the objects R therein. The storage unit 300 may have a storage space in which the objects R are stored. The storage space of the storage unit 300 may be maintained at a high cleanliness level to minimize attachment of impurities, such as particles, to the objects R. Furthermore, the storage unit 300 may include well-known machinery and materials such as support members in which the objects R are stored, and the like.

Figure 2:
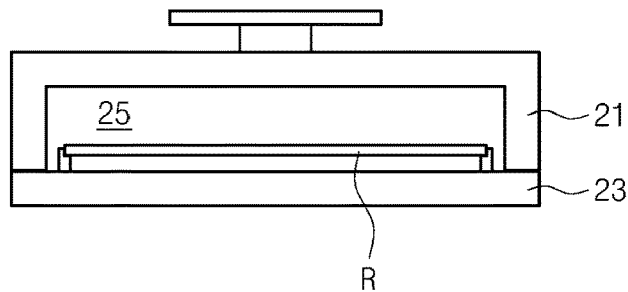
FIG. 2 is a view illustrating a receptacle seated on a load port unit of FIG. 1.

FIG. 2 is a view illustrating a receptacle seated on the load port unit of FIG. 1. The receptacle 20 may be a pod. Referring to FIG. 2, the receptacle 20 seated on the load port unit 100 may include a body 23 and a cover 21. The body 23 may have a base shape. A support member may be provided on the body 23. The body 23 may support the object R through the support member. The support member provided on the body 23 may support an edge region of the object R. The cover 21 may cover the body 23. The cover 21 and the body 23 may be combined with each other to form a storage space 25 in which the object R is accommodated. The cover 21 and the body 23 may be detachable from each other. Furthermore, the body 23 may be detachable from a stage 134 that will be described below.

Figure 3:
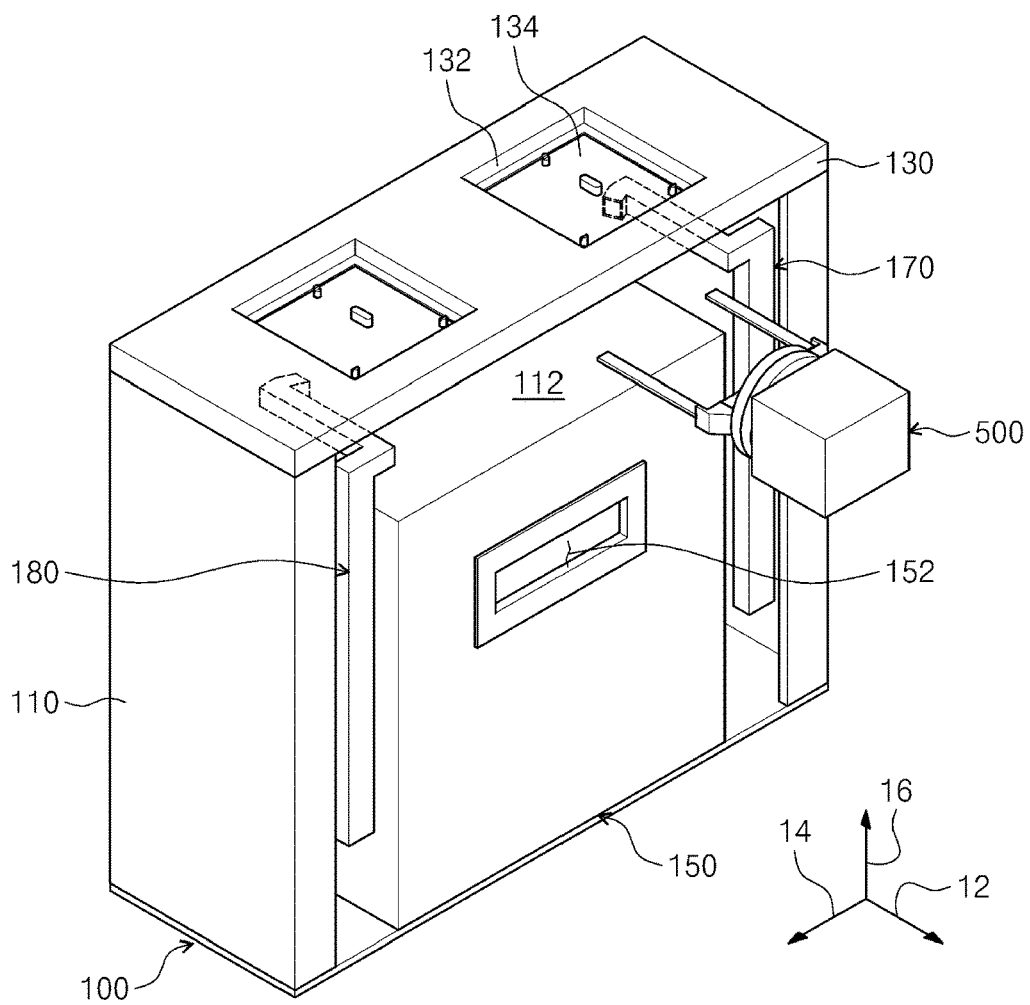
FIG. 3 is a view illustrating the load port unit of FIG. 1 and a transfer unit.
Figure 4:
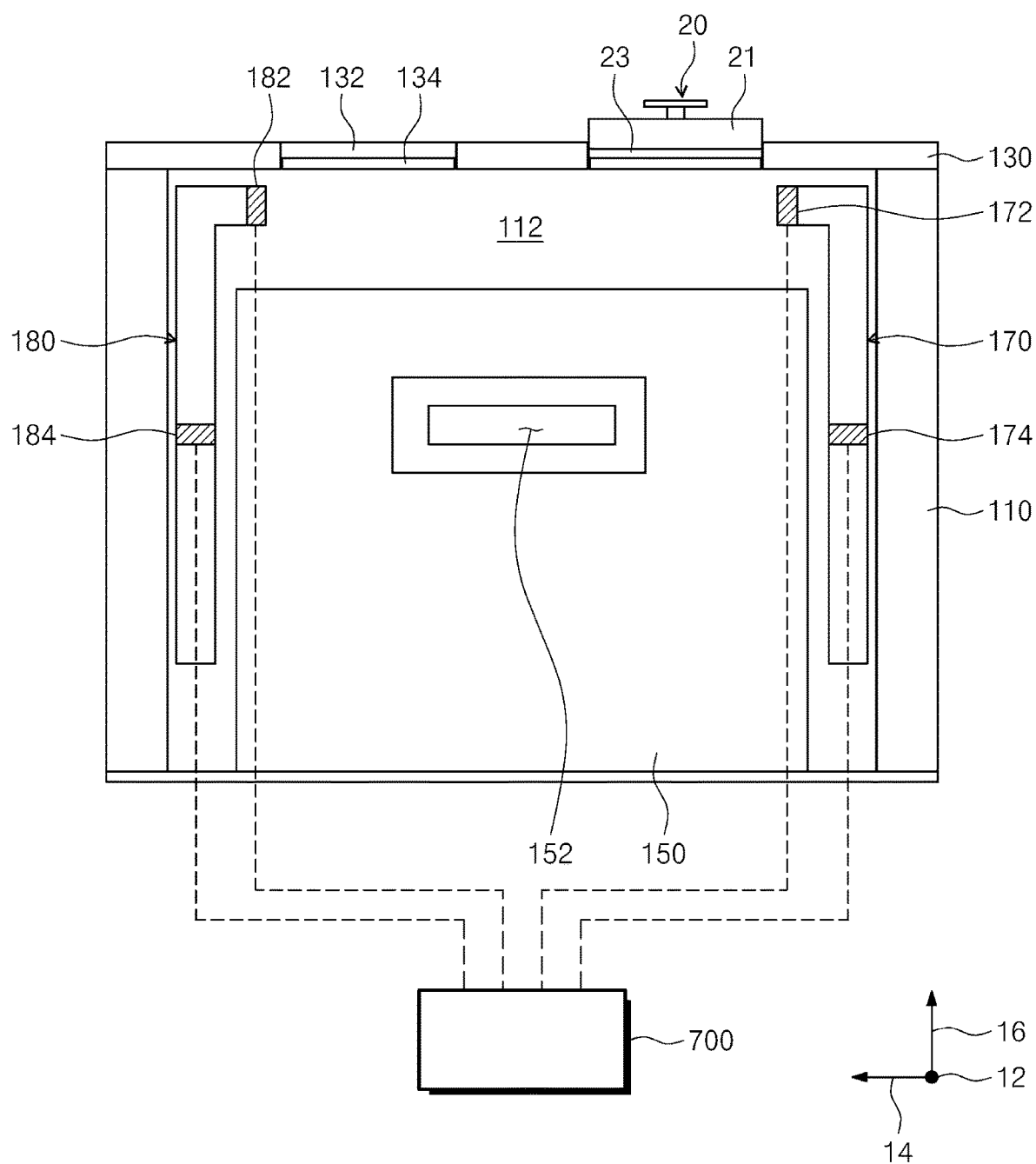
FIG. 4 is a sectional view illustrating the load port unit of FIG. 1.

FIG. 3 is a view illustrating the load port unit of FIG. 1 and the transfer unit, and FIG. 4 is a sectional view illustrating the load port unit of FIG. 1. Referring to FIGS. 3 and 4, the load port unit 100 may include a housing 110, a stage member 130, an inspection member 150, and exhaust tubes 170 and 180.

The housing 110 may have an interior space 112. The housing 110 may have a rectangular parallelepiped shape as a whole. The above-described storage unit 300 may be connected to the housing 110. The inspection member 150 and the exhaust tubes 170 and 180, which will be described below, may be provided in the interior space 112 of the housing 110. For clarity of description of the configuration of the load port, FIG. 3 shows that the housing 110 is open at one side. For example, the above-described storage unit 300 of FIG. 1 may be connected to the one side of housing 110 that is illustrated as being open.

The receptacle 20 may be seated on the stage member 130. The stage member 130 may open the storage space 25 by moving the body 23 of the receptacle 20. The stage member 130 may be provided at the top of the housing 110. The stage member 130 may be provided over the inspection member 150 that will be described below.

The stage member 130 may include a seating part 132 and the stage 134. A plurality of seating parts 132 and a plurality of stages 134 may be provided along the second direction 14. Each of the seating parts 132 may be a recess formed in a plate of the stage member 130. The seating part 132 may have a shape substantially similar to the shape of the receptacle 20 such that the receptacle 20 having the object R accommodated therein is seated in the seating part 132.

The stage 134 may be attached to and detached from the receptacle 20. The stage 134 may be attached to and detached from the body 23 of the receptacle 20. Furthermore, the stage 34 may be coupled with the body 23 and may move the body 23. For example, the stage 34 may be coupled with the body 23 and may separate the body 23 from the cover 21. That is, the stage 134 may move the body 23 in an up/down direction by moving in the up/down direction after coupled with the body 23. When the stage 134 moves the body 23 downward (i.e., introduce the body 23 into the interior space 112 of the housing 110), the position of the cover 21 may be maintained in the seating part 132 (i.e., attached to the seating part 132), and the storage space 25 of the receptacle 20 may be open.

The inspection member 150 may inspect the object R. The inspection member 150 may inspect the object R carried into the load port unit 100. The inspection member 150 may measure the cleanliness level of the object R. For example, the cleanliness level may refer to the degree to which impurities, such as particles, are attached to the object R. The inspection member 150 may have a rectangular parallelepiped shape as a whole. Furthermore, the inspection member 150 may have an opening 152 through which the object R is carried into or out of the inspection member 150. Accordingly, the transfer unit 500 that transfers the object R between the load port unit 100 and the storage unit 300 may carry the object R into and/or out of the inspection member 150 through the opening 152.

The exhaust tubes 170 and 180 may evacuate a spacing space between the body 23 and the cover 21 of the receptacle 20 that are spaced apart from each other. A plurality of exhaust tubes 170 and 180 may be provided. For example, the exhaust tubes 170 and 180 may include the first exhaust tube 170 and the second exhaust tube 180. The first exhaust tube 170 may be provided adjacent to one of the plurality of stages 134. The second exhaust tube 180 may be provided adjacent to another one of the plurality of stages 134. The first exhaust tube 170 and the second exhaust tube 180 may be disposed to be symmetric to each other with respect to the inspection member 150. Furthermore, the first exhaust tube 170 and the second exhaust tube 180 may have shapes symmetric to each other with respect to the inspection member 150 and may have shapes substantially similar to each other. Accordingly, the shape of the first exhaust tube 170 will hereinafter be described. The second exhaust tube 180 may have a shape symmetric to the shape of the first exhaust tube 170, which will be described below, and may have a shape that is the same as, or similar to, the shape of the first exhaust tube 170.

One end of the first exhaust tube 170 may face toward the spacing space formed between the body 23 and the cover 21 of the receptacle 20 that are spaced apart from each other. In an example embodiment, the one end of the first exhaust tube 170 may be adjacent to a portion of the interior space 112 of the housing 110. The portion of the interior space 112 may correspond to a space between body 23, which is introduced into the interior space 112, and the cover 21 which is attached to the seating part 132 of the stage member 130. An opposite end of the first exhaust tube 170 may face toward the interior space 112. For example, the opposite end of the first exhaust tube 170 may face toward the bottom of the interior space 112. The first exhaust tube 170 may have, for example, a shape that is bent one or more times. The first exhaust tube 170 may include, for example, a first portion including the one end and a second portion including the opposite end. The first portion may extend in a horizontal direction relative to an upper surface of the object which is on the body introduced into the interior space 112 of the housing 110. The second portion may extend from the first portion in a vertical direction relative to the horizontal direction. The second portion may extend from the first portion along the up/down direction. Like the first exhaust tube 170, the second exhaust tube 180 may include a first portion including one end facing toward the spacing space between the body 23 and the cover 21 of the receptacle 20 and a second portion extending from the first portion and including an opposite end facing toward the interior space 112.

A first fan 172 and a second fan 174 may be provided in the first exhaust tube 170. A third fan 182 and a fourth fan 184 may be provided in the second exhaust tube 180. The first fan 172 and the second fan 174 provided in the first exhaust tube 170 are substantially the same as, or similar to, the third fan 182 and the fourth fan 184 provided in the second exhaust tube 180. Therefore, the arrangement of the fans will be described in detail based on the first exhaust tube 170.

The second fan 174 provided in the first exhaust tube 170 may be located farther away from the one end of the first exhaust tube 170 than the first fan 172 provided in the first exhaust tube 170. For example, the first fan 172 may be provided at the one end of the first exhaust tube 170. The second fan 174 may be provided between the one end and the opposite end of the first exhaust tube 170. That is, the first fan 172 may be provided in the first exhaust tube 170 so as to be adjacent to the above-described spacing space, and the second fan 174 may be provided in a middle portion of the first exhaust tube 170. Furthermore, the first fan 172 may be provided in the above-described first portion, and the second fan 174 may be provided in the above-described second portion.

The controller 700 may control the storage apparatus 10. The controller 700 may control the load port unit 100 and the transfer unit 500. The controller 700 may control the stage member 130 and the inspection member 150 of the load port unit 100, and the first fan 172, the second fan 174, the third fan 182, and the fourth fan 184 provided in the exhaust tubes 170 and 180. Furthermore, the controller 700 may control the storage apparatus 10 to perform an exhaust method that will be described below. The controller 700 may control the load port unit 100 to perform the exhaust method that will be described below. The controller 700 may control the stage member 130, the first fan 172, the second fan 174, the third fan 182, and the fourth fan 184 of the load port unit 100 to perform the exhaust method that will be described below. The controller 700 may control the stage 134, the first fan 172, the second fan 174, the third fan 182, and the fourth fan 184 of the load port unit 100 to perform the exhaust method that will be described below. The controller 700 may be a computer (or several interconnected computers) including, for example, one or more processors configured by software or firmware, such as a CPU (Central Processing Unit), GPU (graphics processor), and a controller circuit. The software or firmware may be implemented such that the controller 700 may control various parts of the storage apparatus 10 according to an exhaust method of FIG. 5, for example, which will be described later.

Figure 5:
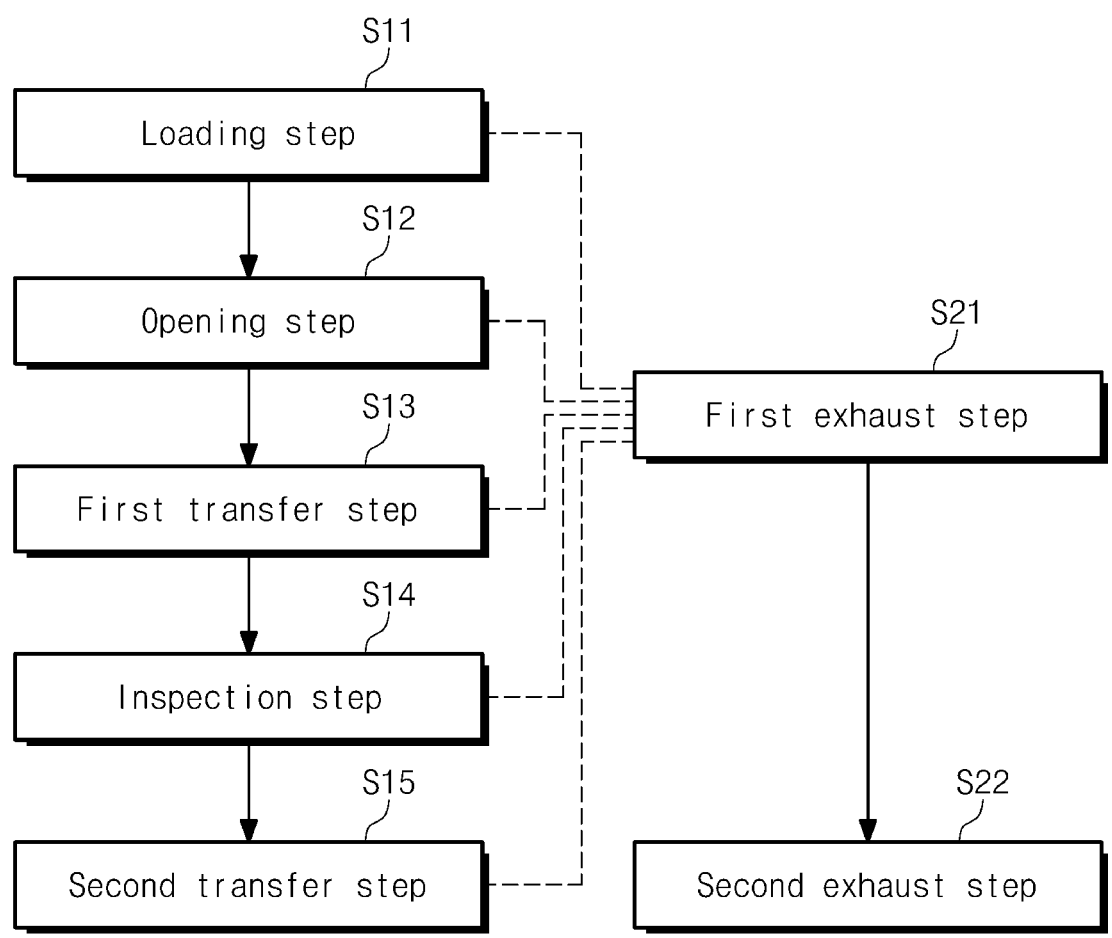
FIG. 5 is a flowchart illustrating an exhaust method according to an embodiment of the inventive concept.

Hereinafter, the exhaust method according to an embodiment of the inventive concept will be described in detail. FIG. 5 is a flowchart illustrating the exhaust method according to the embodiment of the inventive concept. The exhaust method according to the embodiment of the inventive concept may release particles in the receptacle 20 using the storage apparatus 10. The exhaust method according to the embodiment of the inventive concept may release particles in the receptacle 20 using the storage apparatus 10 such that the particles in the receptacle 20 are not attached to the object R.

Referring to FIG. 5, the exhaust method according to the embodiment of the inventive concept may include two main steps: a step of storing the object R in the storage unit 300 and a step of evacuating the spacing space using the first fan 172, the second fan 174, the third fan 182, and the fourth fan 184 while performing the step of storing the object R in the storage unit 300. The step of storing the object R in the storage unit 300 may include a loading step S11, an opening step S12, a first transfer step S13, an inspection step S14, and a second transfer step S15. Furthermore, the step of evacuating the spacing space using the first fan 172, the second fan 174, the third fan 182, and the fourth fan 184 while performing the step of storing the object R in the storage unit 300 may include a first exhaust step S21 and a second exhaust step S22.

Hereinafter, the exhaust method of the inventive concept will be described in detail through evacuation of the spacing space by the first exhaust tube 170. However, the spirit and scope of the inventive concept is not limited to the evacuation of the spacing space by the first exhaust tube 170. For example, the exhaust method, which will be described below, may be identically or similarly applied even when the spacing space is evacuated through the second exhaust tube 180. Furthermore, the exhaust method, which will be described below, may be identically or similarly applied even when the spacing space is evacuated through both the first exhaust tube 170 and the second exhaust tube 180.

The first exhaust step S21 is a step of evacuating the spacing space by driving the first fan 172. The second exhaust step S22 is a step of evacuating the spacing space by driving both the first fan 172 and the second fan 174. The second exhaust step S22 may be performed after the first exhaust step S21. In other words, the second fan 174 may be driven after the first fan 172 is driven.

Figure 6:
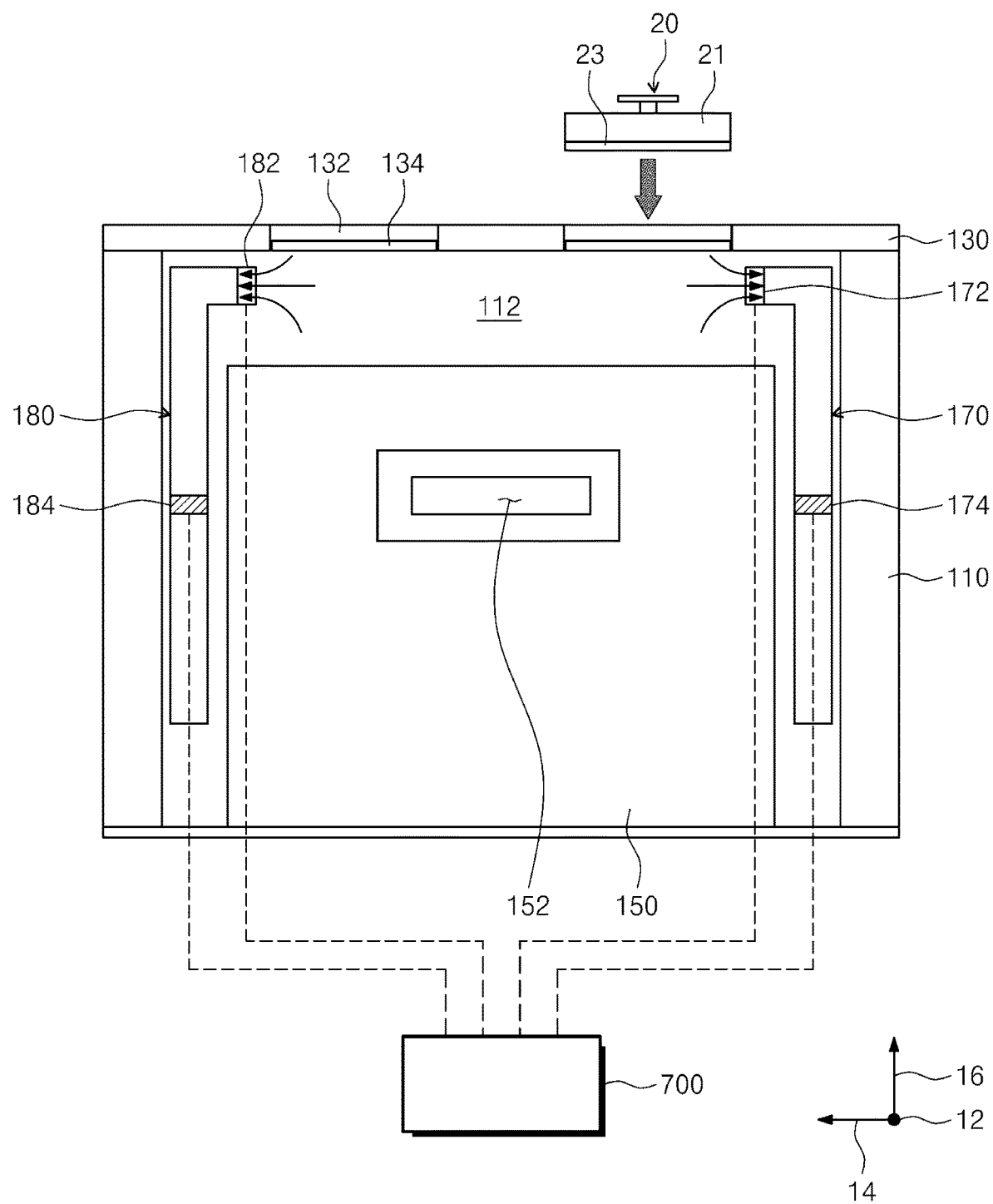
FIG. 6 is a view illustrating a loading step of FIG. 5.

The loading step S11 is a step of loading the receptacle 20 onto the load port unit 100. In the loading step S11, a transfer apparatus, such as an OHT apparatus or the like, may place the receptacle 20 on the stage member 130 included in the load port unit 100 (refer to FIG. 6). The loading step S11 may be performed while the first exhaust step S21 is being performed. In other words, in the loading step S11, only the first fan 172 may be driven. Accordingly, particles floating and/or remaining in the interior space 112 are suctioned into the first exhaust tube 170.

Figure 7:
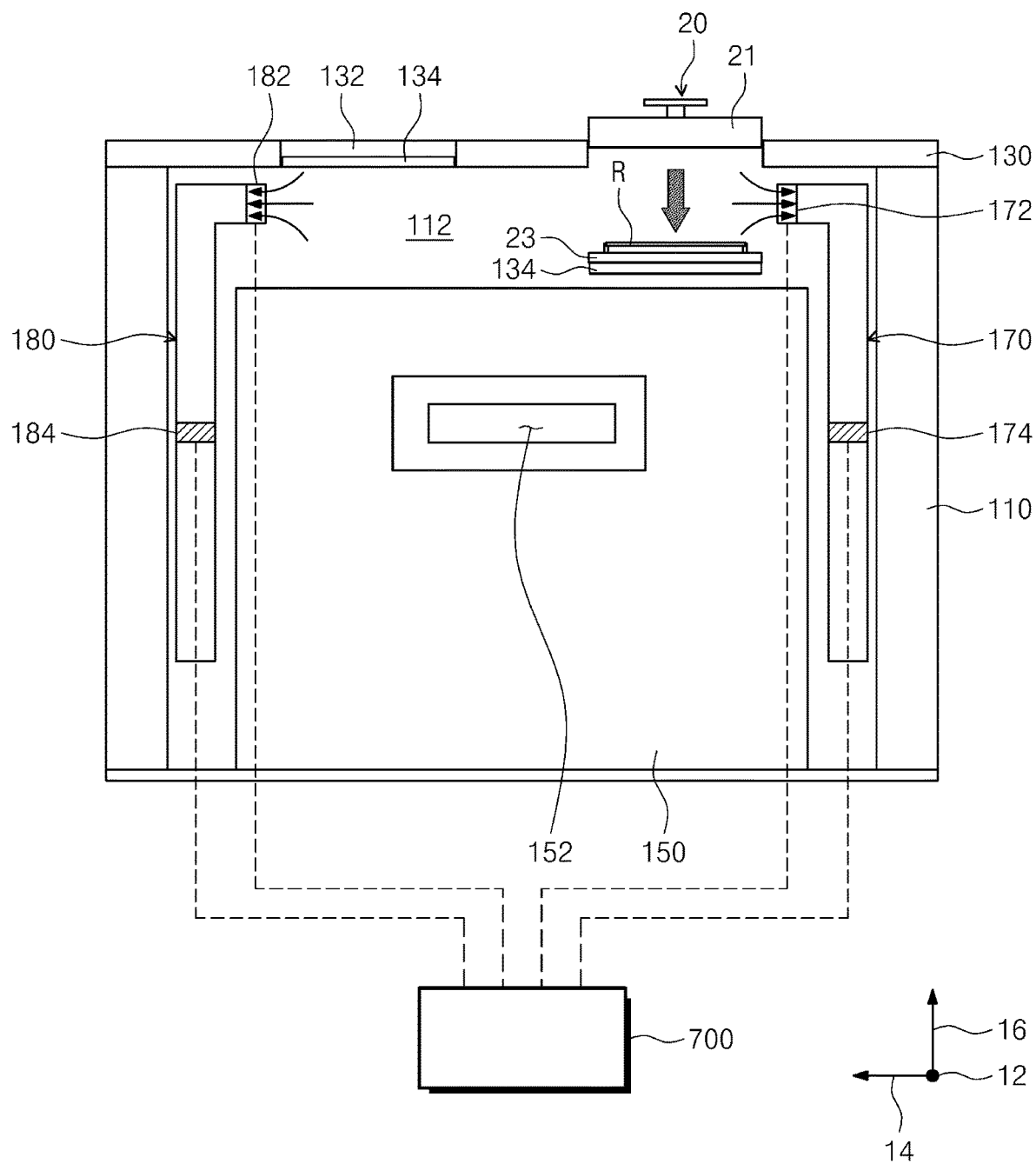
FIG. 7 is a view illustrating an opening step of FIG. 5.

The opening step S12 is a step of opening, by the stage member 130, the storage space 25 of the receptacle 20 (refer to FIG. 7). In the opening step S12, the stage 134 may be coupled with the body 23 of the receptacle 20. The stage 134 coupled with the body 23 may be moved downward. The body 23 and the cover 21 may be separated from each other while the body 23 and the stage 134 are moved downward together. Accordingly, the storage space 25 of the receptacle 20 may be open. The opening step S12 may be performed while the first exhaust step S21 is being performed. In other words, in the opening step S12, only the first fan 172 may be driven. Accordingly, particles floating and/or remaining in the interior space 112 and the storage space 25 are suctioned into the first exhaust tube 170.

Figure 8:
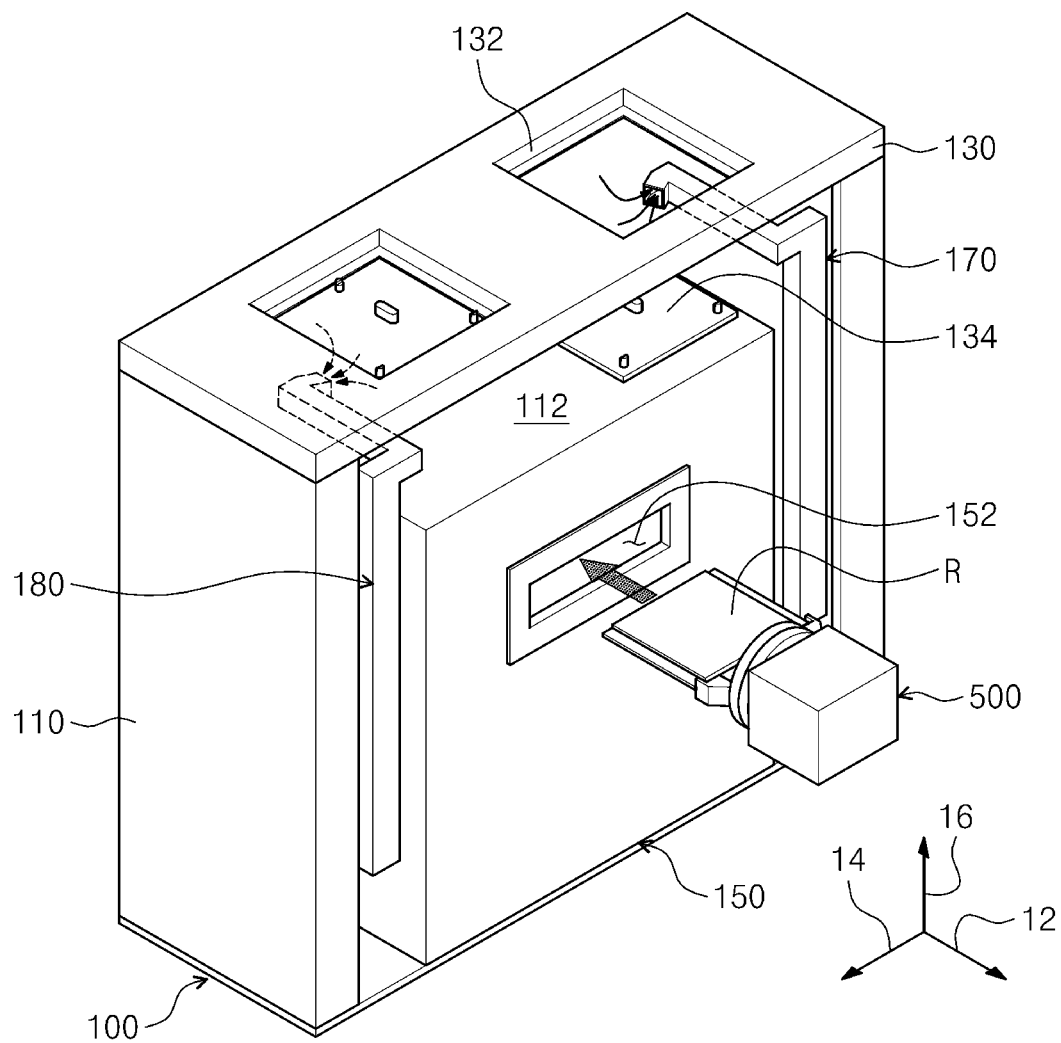
FIG. 8 is a view illustrating a first transfer step of FIG. 5.

The first transfer step S13 is a step of transferring the object R supported on the body 23 into the inspection member 150 of the load port unit 100 (refer to FIG. 8). The first transfer step S13 may be performed while the first exhaust step S21 is being performed. In other words, in the first transfer step S13, only the first fan 172 may be driven.

Figure 9:
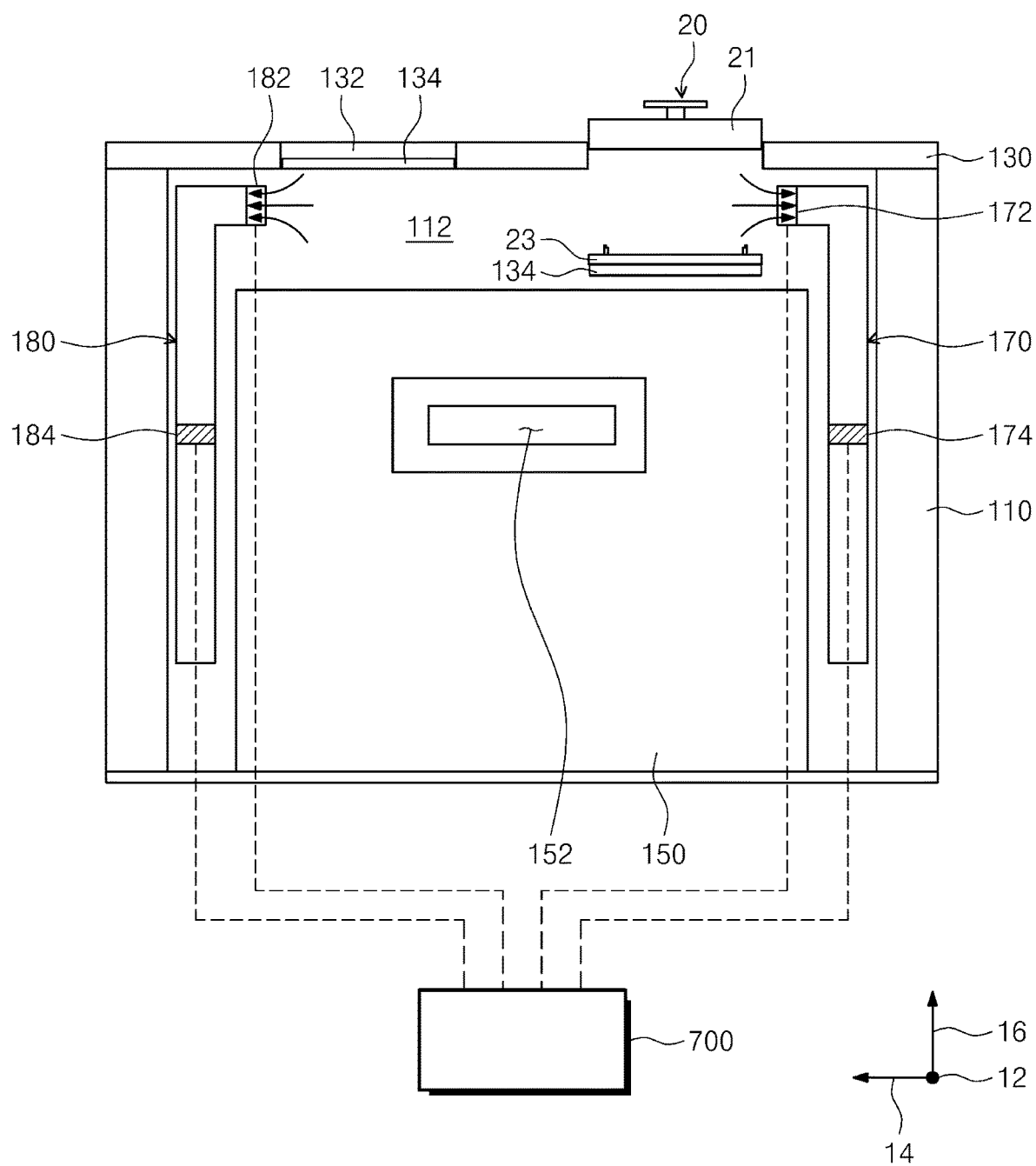
FIG. 9 is a view illustrating an inspection step of FIG. 5.

The inspection step S14 is a step of inspecting the object R in the inspection member 150 (refer to FIG. 9). In the inspection step S14, the inspection member 150 may inspect the cleanliness level of the object R. The inspection step S14 may be performed while the first exhaust step S21 is being performed. In other words, in the inspection step S14, only the first fan 172 may be driven. Although it has been exemplified that the cleanliness level of the object R is inspected in the inspection step S15, the inventive concept is not limited thereto. For example, various well-known inspections related to the object R may be performed in the inspection step S15.

Figure 10:
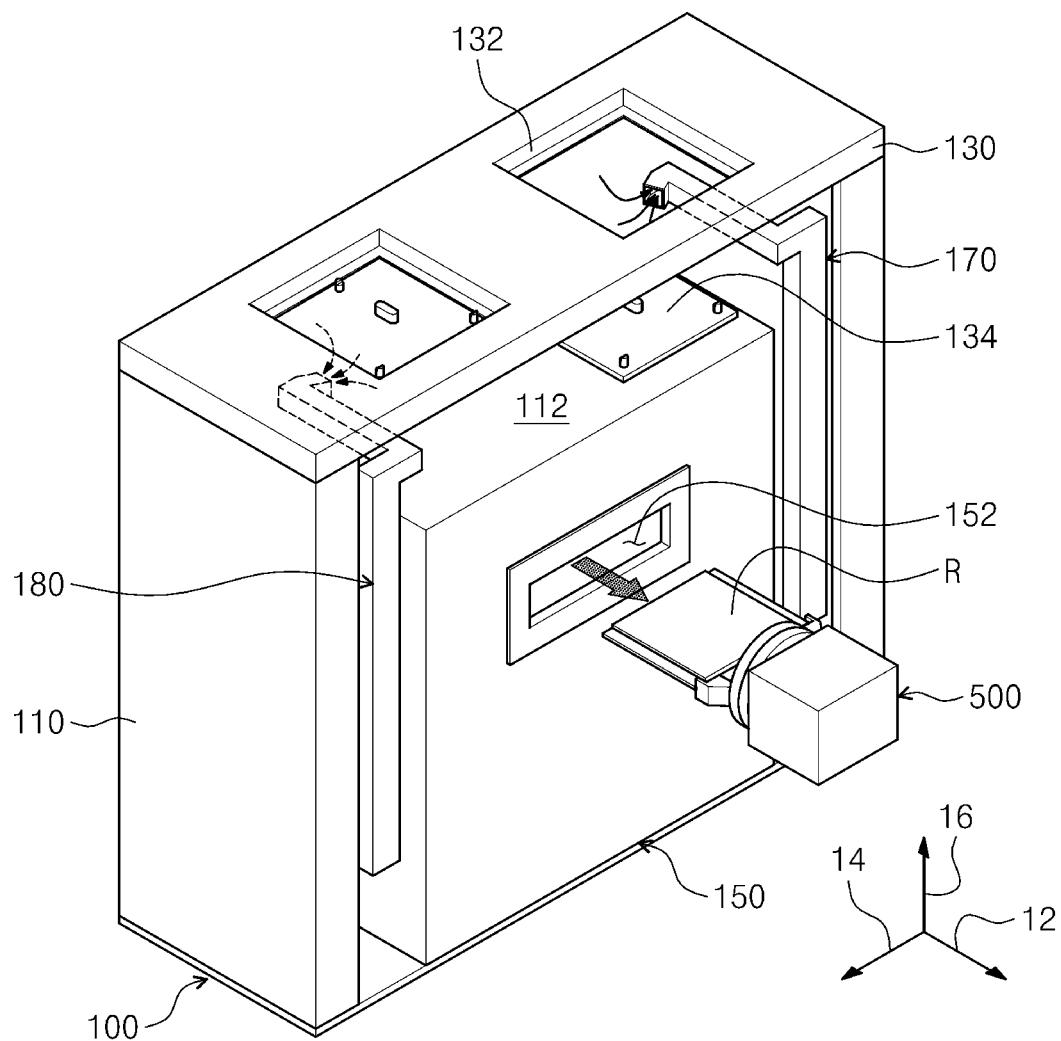
FIG. 10 is a view illustrating a second transfer step of FIG. 5.

The second transfer step S15 is a step of transferring the object R completely inspected in the inspection member 150 to the storage unit 300 and/or the outside (refer to FIG. 10). For example, in the second transfer step S15, the transfer unit 500 may transfer the object R to the storage unit 300 when the cleanliness level of the object R inspected in the inspection step S14 is higher than a preset cleanliness level. Furthermore, in the second transfer step S15, the transfer unit 500 may transfer the object R to the outside of the storage apparatus 10 when the cleanliness level of the object R inspected in the inspection step S14 is lower than the preset cleanliness level. The second transfer step S15 may be performed while the first exhaust step S21 is being performed. In other words, in the second transfer step S15, only the first fan 172 may be driven.

Figure 11:
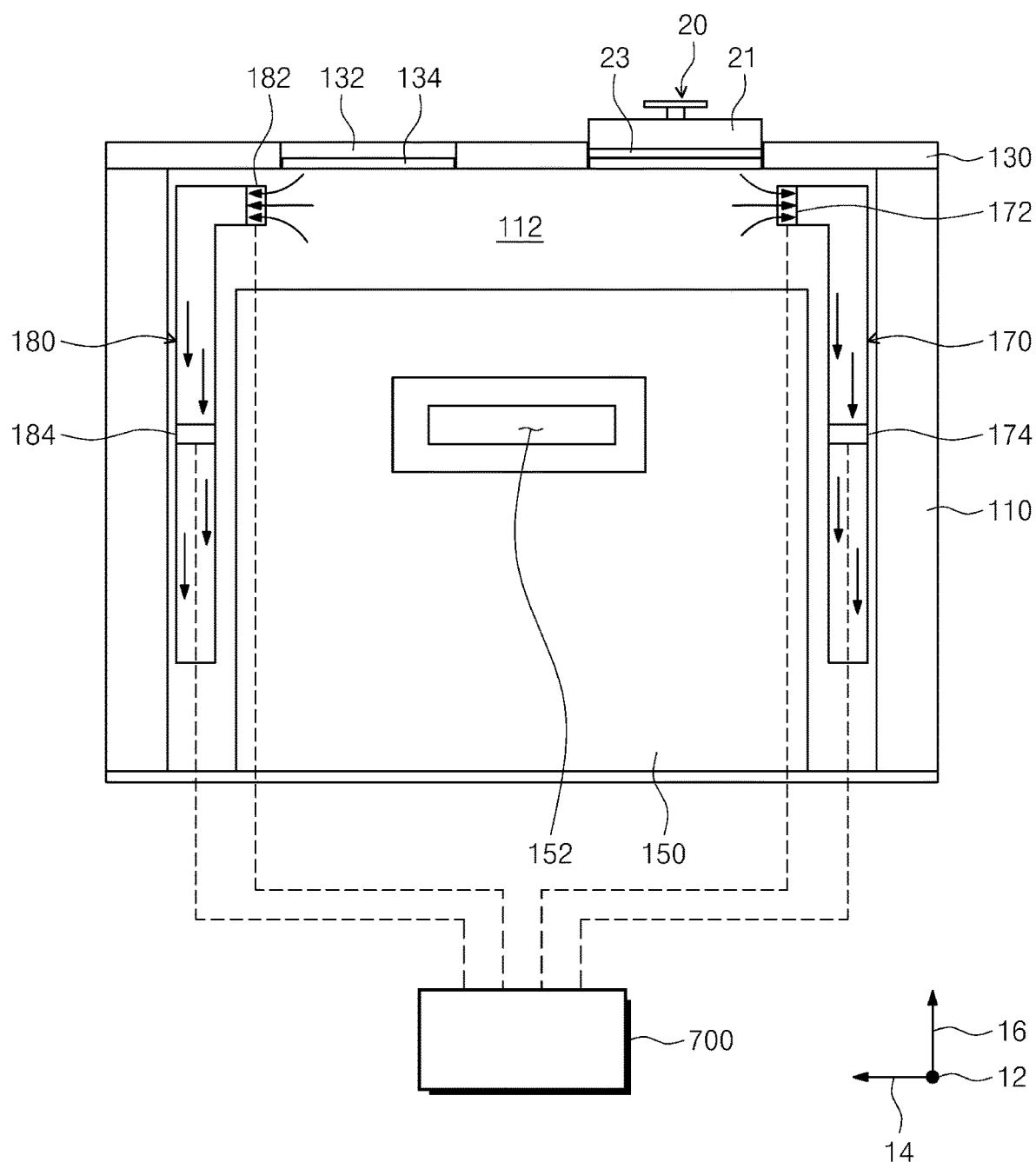
FIG. 11 is a view illustrating a second exhaust step of FIG. 5.

After the second transfer step S15 is completed, the second exhaust step S22 is performed. In the second exhaust step S22, both the first fan 172 and the second fan 174 may be driven. As the second fan 174 is driven, an air flow slightly stagnant in the first exhaust tube 170 flows downward along the first exhaust tube 170 (refer to FIG. 11).

In the exhaust method according to the embodiment of the inventive concept, only the first fan 172 is driven while the object R is in the interior space 112. After the object R is carried out of the interior space 112, both the first fan 172 and the second fan 174 are driven. Accordingly, attachment of particles floating and/or remaining in the interior space 112 to the object R may be minimized.

Figure 12:
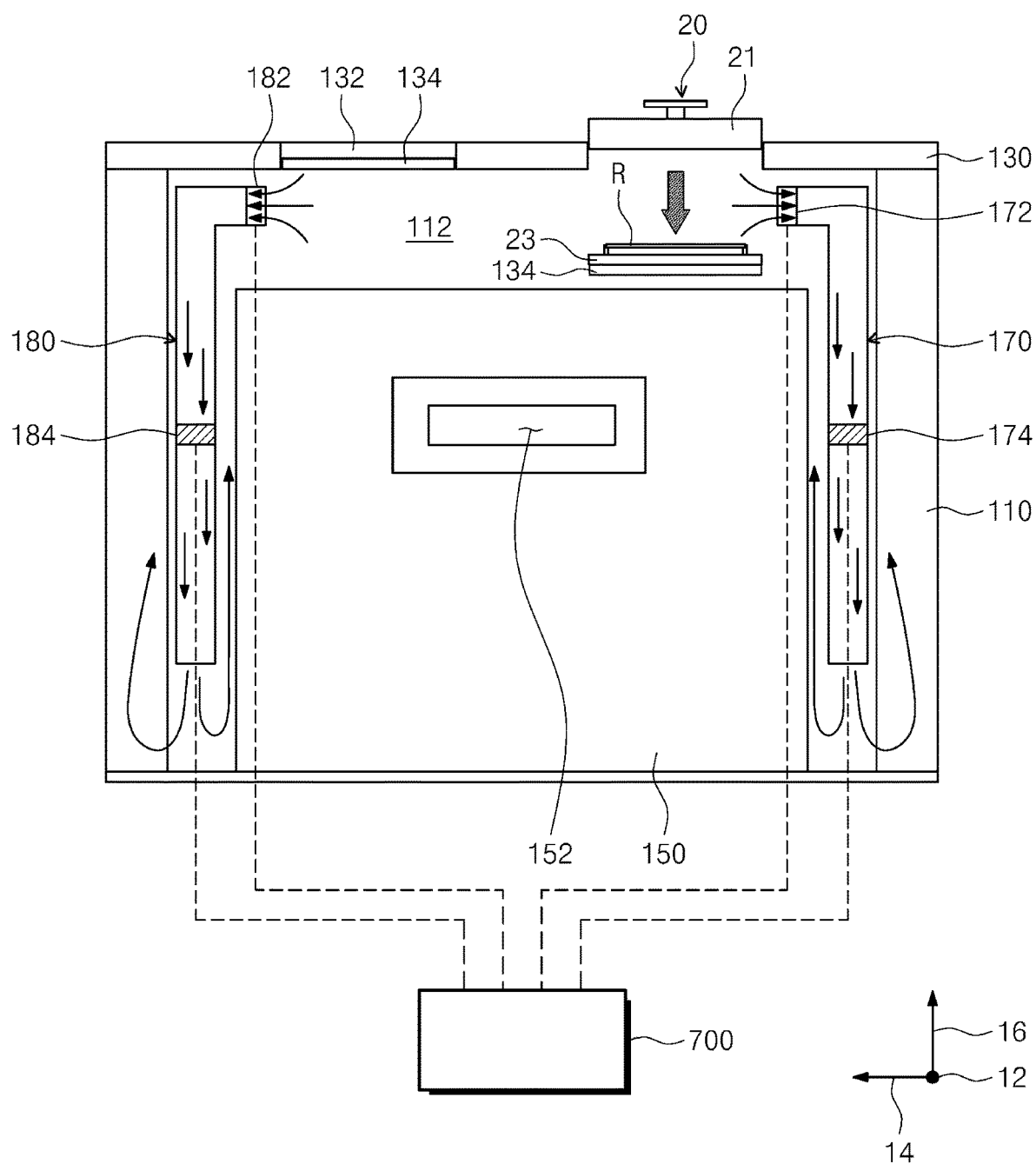
FIG. 12 is a view illustrating an air flow when both a first fan and a second fan are driven in the opening step of FIG. 5.

More specifically, unlike in the exhaust method according to the embodiment of the inventive concept, an air flow in the first exhaust tube 170 is changed into a strong downward air flow by the second fan 174 when both the first fan 172 and the second fan 174, as illustrated in FIG. 12, are driven in the opening step S12 in which the object R is in the interior space 112. The downward air flow collides with the bottom of the housing 110 and generates a vortex. The generated vortex flows backward to an upper region of the interior space 112 and floats particles. The floated particles may be attached to the object R, and the particles attached to the object R may cause a process failure.

However, according to the embodiment of the inventive concept, particles that remain in the receptacle 20 or are generated when the body 23 is separated from the cover 21 are suctioned into the first exhaust tube 170 by driving only the first fan 172 while the object R is in the interior space 112. Accordingly, attachment of particles to the object R may be minimized. Furthermore, a phenomenon in which particles flow backward by a downward air flow may be minimized by driving only the first fan 172 while the object R is in the interior space 112. Accordingly, attachment of particles to the object R may be minimized. After the object R is carried out of the interior space 112, the second fan 174 may be driven to prevent particles from floating or remaining in the first exhaust tube 170.

Although it has been exemplified that only the first fan 172 is driven while the object R is in the interior space 112, the inventive concept is not limited thereto. For example, while the object R is in the interior space 112, both the first fan 172 and the second fan 174 may be driven, in which case the first fan 172 may rotate in a direction to allow particles to be suctioned into the first exhaust tube 170, and the second fan 174 may rotate in an opposite direction to that of the first fan 172. At this time, the revolutions per unit time of the second fan 174 may be smaller than the revolutions per unit time of the first fan 172. In this case, more particles may stagnate in the first exhaust tube 170 while the object R is in the interior space 112.

According to the embodiments of the inventive concept, the cleanliness level of an object may be maintained at a high level.

Furthermore, according to the embodiments of the inventive concept, attachment of impurities, such as particles, to an object may be minimized.

In addition, according to the embodiments of the inventive concept, attachment of particles floating and/or remaining in a load port unit to an object may be minimized.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A storage apparatus for storing an object, the storage apparatus comprising:
   a load port unit configured to load or unload a receptacle, the receptacle having a body and a cover which are detachably attached to each other and further having a first storage space which is defined by the body and the cover attached to each other, the object being accommodated in the first storage space of the receptacle and placed on the body;
   a storage unit having a second storage space in which the object is to be stored;
   a transfer unit configured to transfer the object between the first storage space of the load port unit and the second storage space of the storage unit; and
   a controller coupled to the load port unit and the transfer unit,
   wherein the load port unit includes:
   a housing having an interior space;
   a stage member provided on top of the housing and configured to receive the receptacle and separate the body from the cover so that the body on which the object is placed is introduced into the interior space of the housing and the cover of the receptacle is attached to the stage member; and
   an exhaust tube configured to evacuate the interior space of the housing,
   wherein the exhaust tube includes a first end which is adjacent to a portion of the interior space of the housing, the portion of the interior space corresponding to a space between the cover attached to the stage member and the body introduced into the interior space of the housing, and a second end adjacent to a bottom surface of the housing,
   wherein the exhaust tube is provided with a first fan that is installed at the first end of the exhaust tube and a second fan that is installed at a location of the exhaust tube between the first end and the second end,
   wherein the first fan and the second fan are positioned at an inside of the exhaust tube, and
   wherein the controller is configured to control the first fan and the second fan such that the second fan is driven after the first fan is driven.

2. The storage apparatus of claim 1,
   wherein the controller is configured to control the first fan and the second fan such that the second fan is driven after the stage member completely separates the body of the receptacle from the cover thereof.

3. The storage apparatus of claim 1,
wherein the first fan is configured to suck an air of the interior space of the housing in a horizontal direction relative to an upper surface of the object which is on the body introduced in the interior space of the housing, and
wherein the second fan is configured to move the sucked air by the first fan in a vertical direction, relative to the horizontal direction, toward the second end.

4. The storage apparatus of claim 1,
wherein the exhaust tube includes:
a first portion including the first end of the exhaust tube and extending in a horizontal direction relative to an upper surface of the object which is on the body introduced in the interior space of the housing; and
a second portion extending in a vertical direction, relative to the horizontal direction, from the first portion and including the second end of the exhaust tube.

5. The storage apparatus of claim 4,
wherein the second fan is provided in the second portion.

6. A load port unit for loading or unloading a receptacle, wherein the receptacle having a body and a cover which are detachably attached to each other and further having a first storage space which is defined by the body and the cover attached to each other, the first storage space of the receptacle accommodating an object which is placed on the body, the load port unit comprising:
a housing having an interior space;
a stage member provided on top of the housing and configured to receive the receptacle and separate the body from the cover so that the body on which the object is placed is introduced into the interior space of the housing and the cover of the receptacle is attached to the stage member; and
an exhaust tube configured to evacuate the interior space of the housing,
wherein the exhaust tube includes a first end which is adjacent to a portion of the interior space of the housing, the portion of the interior space corresponding to a space between the cover attached to the stage member and the body introduced into the interior space of the housing, and a second end adjacent to a bottom surface of the housing,
wherein the exhaust tube is provided with a first fan that is installed at the first end of the exhaust tube, and a second fan that is installed at a location of the exhaust tube between the first end and the second end,
wherein the first fan and the second fan are positioned at an inside of the exhaust tube, and
wherein the first fan is configured such that the first fan is driven during a time when the object is on the body introduced into the interior space of the housing.

7. The load port unit of claim 6,
wherein the first fan and the second fan are configured such that the first fan and the second fan are driven after the object is carried out of the interior space.

8. The load port unit of claim 6,
wherein the first fan is configured to suck an air of the interior space of the housing in a horizontal direction relative to an upper surface of the object which is on the body introduced in the interior space of the housing, and
wherein the second fan is configured to move the sucked air by the first fan in a vertical direction, relative to the horizontal direction, toward the second end.

9. The load port unit of claim 6,
wherein the exhaust tube includes:
a first portion including the first end of the exhaust tube and extending in a horizontal direction relative to an upper surface of the object which is on the body introduced in the interior space of the housing; and
a second portion extending in a vertical direction, relative to the horizontal direction, from the first portion and including the second end of the exhaust tube.

10. A storage apparatus for storing a reticle, the storage apparatus comprising:
a load port unit configured to load or unload a receptacle, the receptacle having a body and a cover which are detachably attached to each other and further having a first storage space which is defined by the body and the cover attached to each other, the reticle being accommodated in the first storage space of the receptacle and placed on the body;
a storage unit having a second storage space in which the reticle is stored; and
a transfer unit configured to transfer the reticle between the load port unit and the storage unit,
wherein the load port unit includes:
a housing having an interior space;
a stage member provided on top of the housing and configured to receive the receptacle and separate the body from the cover so that the body on which the reticle is placed is introduced into the interior space of the housing and the cover of the receptacle is attached to the stage member; and
an exhaust tube configured to evacuate the interior space of the housing,
wherein the exhaust tube includes a first end which is adjacent to a portion of the interior space of the housing, the portion of the interior space corresponding to a space between the cover attached to the stage member and the body introduced into the interior space of the housing, and a second end adjacent to a bottom surface of the housing,
wherein the exhaust tube is provided with a first fan that is installed at the first end of the exhaust tube and a second fan that is installed at a location of the exhaust tube between the first end and the second end, and
wherein the first fan and the second fan are positioned at an inside of the exhaust tube.

11. The storage apparatus of claim 10,
wherein the storage apparatus further comprises a controller which is configured to control the first fan and the second fan such that the second fan is driven after the first fan is driven.

12. The storage apparatus of claim 11,
wherein the controller is configured to control the first fan and the second fan such that the second fan is driven after the stage member completely separates the body of the receptacle from the cover thereof.

* * * * *